US007973259B2

(12) United States Patent
Tsai et al.

(10) Patent No.: US 7,973,259 B2
(45) Date of Patent: Jul. 5, 2011

(54) SYSTEM FOR TESTING AND SORTING ELECTRONIC COMPONENTS

(75) Inventors: Pei Wei Tsai, Hong Kong (HK); Chak Tong Sze, Hong Kong (HK); Sai Kit Wong, Hong Kong (HK); Fong Shing Yip, Hong Kong (HK)

(73) Assignee: ASM Assembly Automation Ltd, Hong Kong (HK)

( * ) Notice: Subject to any disclaimer, the term of this patent is extended or adjusted under 35 U.S.C. 154(b) by 779 days.

(21) Appl. No.: 11/753,880

(22) Filed: May 25, 2007

(65) Prior Publication Data

US 2008/0290004 A1 Nov. 27, 2008

(51) Int. Cl.
*B07C 5/344* (2006.01)
(52) U.S. Cl. ......... 209/573; 209/556; 209/571; 414/935
(58) Field of Classification Search ............... 209/551, 209/552, 556, 571–573; 324/158.1; 414/935–941
See application file for complete search history.

(56) References Cited

U.S. PATENT DOCUMENTS

| | | | | |
|---|---|---|---|---|
| 4,465,195 A | * | 8/1984 | Buer et al. ............ | 209/704 |
| 6,248,967 B1 | * | 6/2001 | Nakamura ............ | 209/573 |
| 6,396,295 B1 | * | 5/2002 | Robinson et al. ...... | 324/765 |
| 2002/0036161 A1 | * | 3/2002 | Nemoto et al. ........ | 209/573 |
| 2006/0171577 A1 | * | 8/2006 | Schmidt et al. ....... | 382/128 |
| 2007/0102327 A1 | * | 5/2007 | Tseng et al. .......... | 209/571 |

FOREIGN PATENT DOCUMENTS

| | | |
|---|---|---|
| JP | 07-260880 | 10/1995 |
| JP | 2001-356145 | 12/2001 |
| JP | 2005-219002 | 8/2005 |

OTHER PUBLICATIONS

Japanese Office Action, dated Nov. 18, 2010, issued in corresponding Japanese Patent Application No. 2008-009581, total 3 pages. English translation, 3 pages. Total pages 6.

* cited by examiner

*Primary Examiner* — Stefanos Karmis
*Assistant Examiner* — Kalyanavenkateshware Kumar
(74) *Attorney, Agent, or Firm* — Ostrolenk Faber LLP

(57) ABSTRACT

A sorting system is provided for electronic components such as LED devices which includes a testing station for testing and determining a characteristic of each electronic component. A first tray has a plurality of receptacles for receiving tested electronic components and a second tray has more receptacles than the first tray for receiving tested electronic components. Electronic components comprising tested characteristics that occur with greater frequency are loaded into the receptacles of the first tray and electronic components comprising tested characteristics that occur with lower frequency are loaded into the receptacles of the second tray.

24 Claims, 4 Drawing Sheets

SYSTEM FOR TESTING AND SORTING ELECTRONIC COMPONENTS

FIELD OF THE INVENTION

The present invention relates to a method and an apparatus for testing, and thereafter separating and sorting electronic components, such as light emitting diodes, according to the characteristics of the electronic components.

BACKGROUND AND PRIOR ART

A Light Emitting Diode (LED) is a display and lighting technology which is widely used in electrical and electronic products on the market as LEDs use less power, have longer lifetimes and produce little heat as compared to traditional incandescent light bulbs, as well as emit colored light. After assembly of an LED, each LED is tested to determine its optical and electrical properties before being sorted according to its determined characteristics. Since the characteristics of the assembled LEDs vary widely, an elaborate sorting system is used to classify and separate them after assembly.

In a conventional sorting system for LEDs, the LEDs are loaded onto a test handler. Characterization of LEDs is carried out by conducting tests such as optical and electrical tests. After testing, the LEDs are sorted in an offloader which has bins arranged in a matrix form. Each bin is assigned to receive LEDs having certain predetermined characteristic(s). An output tube channels each LED which is to be transferred into an allocated bin. Typically, the LED passes through an output confirmation sensor before being unloaded into the bin to ensure that the LED has successfully passed through the output tube. The next LED would only be unloaded into the output tube to an allocated bin after the output confirmation sensor has determined that the preceding LED has been successfully transferred.

It has been noted that while over a hundred bins may be deployed for collecting a batch of LEDs that are being sorted, some bins are typically utilised more often than others. This is due to the fact that some LEDs have characteristics which are more commonly exhibited than others. Hence, the bins corresponding to these LEDs are more frequently accessed by the output tube. In this regard, it would be useful for the bins to be classified according to more frequently used bins and less frequently used bins so that the output tube may be more efficiently utilized.

FIG. 1 is a schematic top view of a normal bin tray 14 in a conventional sorting system with a high speed bin tray 12 according to the preferred embodiment of the invention superimposed over it. Referring to the conventional sorting system comprising the normal bin tray 14, it would take a longer time for an output tube to move from bin a to bin b than for the output tube to move from bin a to bin c, which is of a shorter distance. Furthermore, if consecutive binning is necessary to alternately transfer LEDs to bin b and bin d, there is substantial motion time incurred for the output tube to repeatedly move between bins b and d. It would therefore be advantageous to place bins which are used more frequently in close proximity to one another in order to minimise the motion distance and time of the output tube. By reducing the motion distance of the output tube from one bin to another, the speed of sorting and the throughput of the LEDs may be increased. Moreover, by concentrating the frequently-used bins at one location, more compact and faster positioning mechanisms may be adopted for output devices used for these bins.

Additionally, in a conventional sorting system, each bin is preset to collect a certain number of LEDs. Once a preset counter determines that a maximum number of LEDs in a bin has been reached, it is necessary to set the conventional LED sorting machine to idle to allow the removal of the bin. Thus, the resultant down-time reduces the LED sorting speed and throughput. It would therefore be desirable for sorting operations to be allowed to continue while an operator removes some of the bins which are full.

SUMMARY OF THE INVENTION

It is thus an object of the invention to seek to provide a method and an apparatus for sorting electronic components having more common characteristics at a relatively higher sorting speed to achieve a higher overall throughput as compared to the conventional sorting systems described above.

According to a first aspect of the invention, there is provided a sorting apparatus for electronic components, comprising: a testing station for testing and determining a characteristic of each electronic component; a first tray with a plurality of receptacles for receiving tested electronic components; and a second tray with more receptacles than the first tray for receiving tested electronic components; wherein electronic components comprising tested characteristics that occur with greater frequency are loaded into the receptacles of the first tray and electronic components comprising tested characteristics that occur with lower frequency are loaded into the receptacles of the second tray.

According to a second aspect of the invention, there is provided a method of sorting electronic components, comprising the steps of: testing the electronic components for determining a characteristic of each electronic component; determining which tested characteristics of the electronic components occur most frequently; loading electronic components comprising tested characteristics that occur with greater frequency into receptacles of a first tray having a plurality of receptacles for receiving tested electronic components; and loading electronic components comprising tested characteristics that occur with lower frequency into receptacles of a second tray which has more receptacles than the first tray.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of a preferred embodiment of the invention when considered with the accompanying drawings, in which.

DETAILED DESCRIPTION OF THE PREFERRED EMBODIMENT OF THE INVENTION

The preferred embodiment of the present invention will be described hereinafter with reference to the accompanying drawings.

Figure 1:
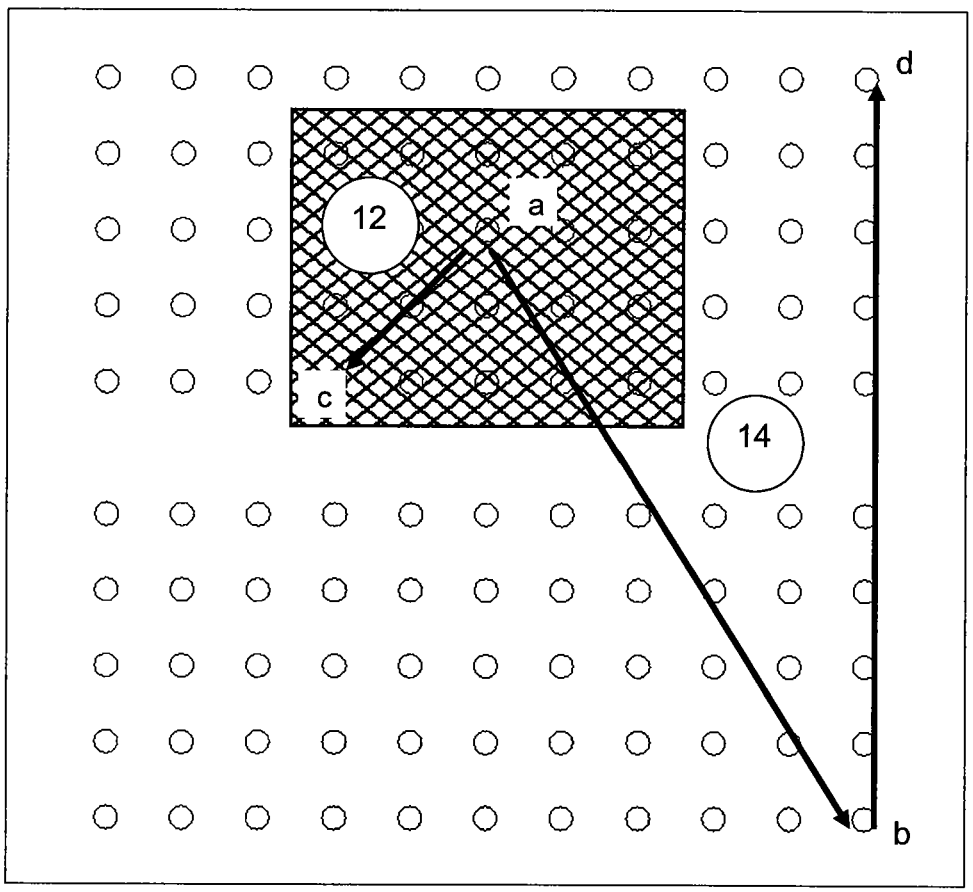
FIG. 1 is a schematic top view of a normal bin tray in a conventional sorting system with a high speed bin tray according to the preferred embodiment of the invention superimposed over it.

FIG. 1 is a schematic top view of a first tray, such as a high speed bin tray 12 according to the preferred embodiment of the invention, superimposed over a second tray, such as a normal bin tray 14. The high speed bin tray 12 and the normal bin tray 14 have receptacles in the form of bins for receiving tested electronic components, such as LEDs. This figure illustrates the advantage of arranging the bins that are more frequently used into the high speed bin tray 12. As the high speed bin tray 12 has fewer receptacles and is thus smaller than the normal bin tray 14, the motion distance and time taken for an output tube to move from bin a to bin c in the high speed bin tray 12 is shorter than from bin a to bin b. Thus, if a more frequently used bin at position b were to be consolidated into the high speed bin tray 12 at position c, a higher sorting speed and throughput of the LEDs that have more common characteristics can be achieved.

Figure 2:
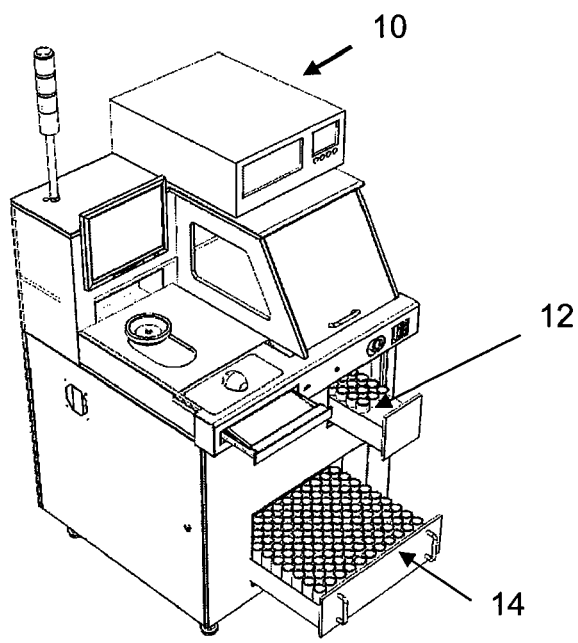
FIG. 2 is an isometric view of an LED test handler showing the location of two types of bin trays, comprising a high speed bin tray and a normal bin tray, in accordance with the preferred embodiment of the invention.

FIG. 2 is an isometric view of a sorting apparatus, such as an LED test handler 10, showing the location of the high speed bin tray 12 and the normal bin tray 14, in accordance with the preferred embodiment of the invention. LEDs comprising tested characteristics that occur with greater frequency are loaded into the bins of the high speed bin tray 12 and LEDs comprising tested characteristics that occur with lower frequency are loaded into the bins of the normal bin tray 14. The high speed bin tray 12 comprises a sufficient number of bins to receive only LEDs that have characteristics which occur with greater frequency whereas the normal bin tray 14 comprises a sufficient number of bins to collect all the LEDs with different characteristics.

Figure 3:
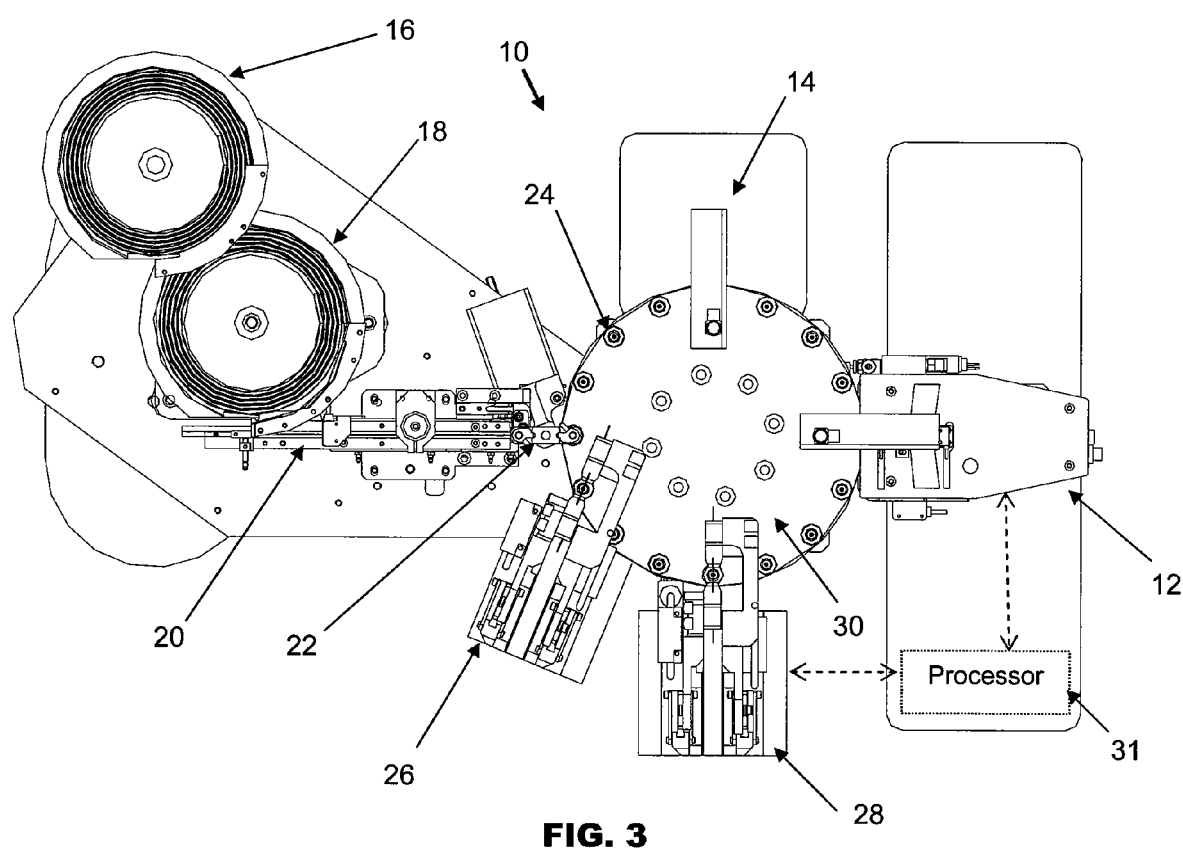
FIG. 3 is a top view of the LED test handler incorporating the high speed bin tray according to the preferred embodiment of the invention.

FIG. 3 is a top view of the LED test handler 10 incorporating the high speed bin tray 12 according to the preferred embodiment of the invention. The LEDs to be tested and sorted are placed into a hopper 16 before being loaded into a bowl feeder 18 for dispensing onto a conveyor 20. Each LED is transported by the conveyor 20 to a rotary pick arm module 22 where a pick arm transfers each LED onto a suction pad 24 on a turntable 30. The turntable 30 rotates the LED incrementally to various stations comprising a unit preciser 26, a testing station such as a test contactor 28, a high speed bin tray 12 and a normal bin tray 14 located adjacent to the turntable 30. The test contactor 28 is operative to test and determine a characteristic of each LED. The turntable 30 is operative to move the LEDs sequentially from the unit preciser 26 to the test contactor 28, then sequentially from the test contactor 28 to the high speed bin tray 12 and the normal bin tray 14. Each LED is configured to pass through a location of the high speed bin tray 12 prior to arriving at a location of the normal bin tray 14. After the LED is dropped into either the high speed bin tray 12 or the normal bin tray 14, the turntable 30 rotates an emptied suction pad 24 back to the location of the rotary pick arm module 22 where the pick arm transfers another LED onto the suction pad 24.

At the unit preciser 26, the LED is aligned to orientate it with testing devices at the test contactor 28. Tests such as optical and electrical tests are carried out to ascertain the characteristics of each LED at the test contactor 28. At this stage, the characteristics of LEDs that are more common have not been determined if this is a new batch of LEDs. Therefore, after testing, all the LEDs are automatically moved to the normal bin tray 14 where they are dropped into assigned bins in the normal bin tray 14 according to the characteristics of the LEDs.

After a preset number of LEDs have been tested, a set of bins constituting more frequently used bins can be determined by the test handler 10. This more frequently used bin set comprises a plurality of bin numbers. A processor 31, such as the PC of the LED test handler 10, is operative to determine which characteristics of the LEDs occur most frequently. The processor 31 also assigns the bin numbers to the bins in the high speed bin tray 12. Each LED that has been tested may thereafter be either transferred to a bin in the high speed bin tray 12 or to a bin in the normal bin tray 14 depending on the characteristics of the LED. If an LED has been assigned a high speed bin, it would be dropped into its allocated bin at the position of the high speed bin tray 12. An LED that has not been dropped into a bin in the high speed bin tray 12 would be rotated to the normal bin tray 14 by turntable 30 and dropped into its allocated bin in the normal bin tray 14.

Figure 4:
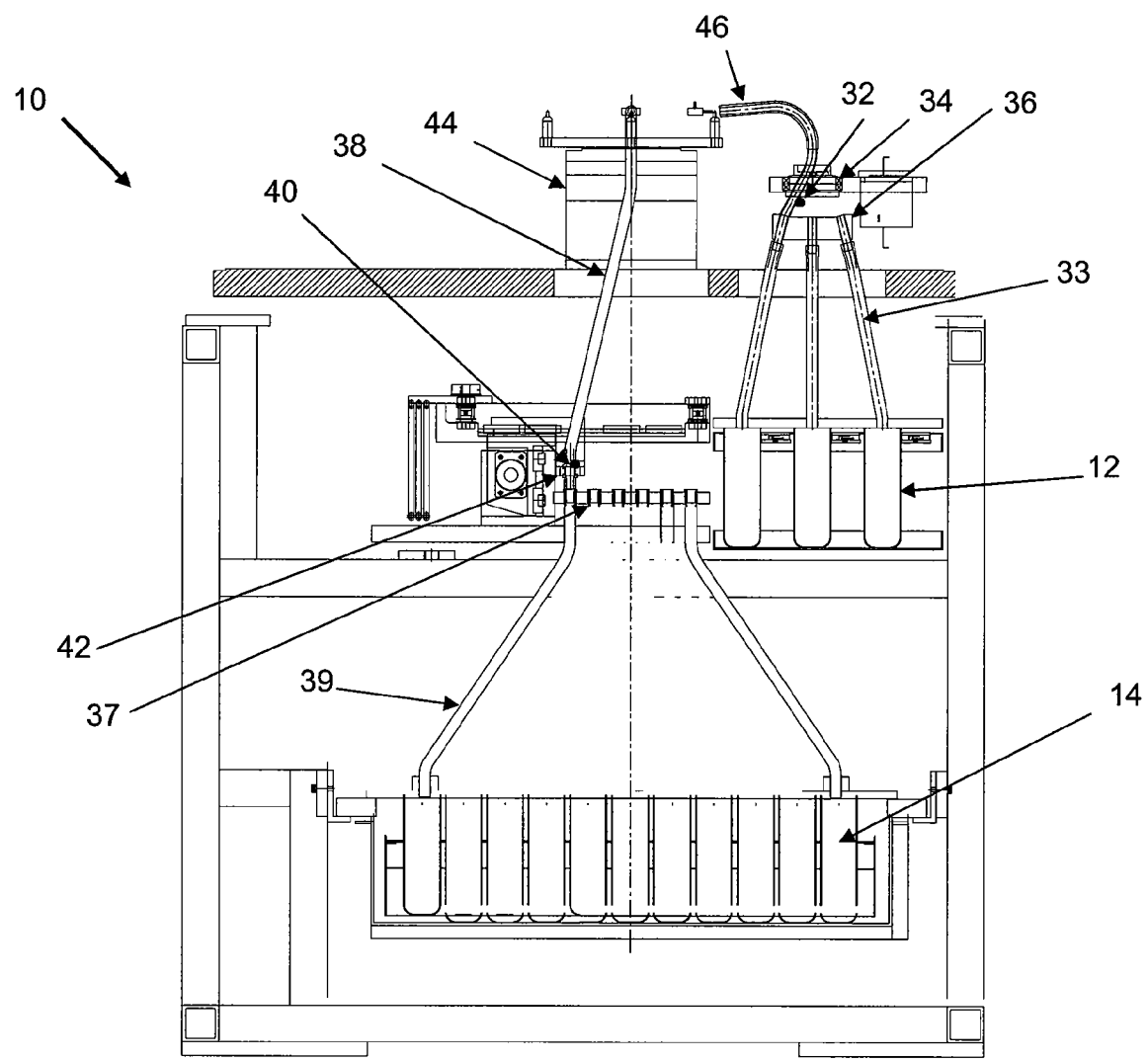
FIG. 4 is a sectional front view of the LED test handler showing the positions of the high speed bin tray and the normal bin tray.

FIG. 4 is a sectional front view of the LED test handler 10 showing the positions of the high speed bin tray 12 and the normal bin tray 14. The LEDs are transferable between the locations of the high speed bin tray 12 and the normal bin tray 14 along a travel path defined by the path traveled by the suction pads 24 of the turntable 30. The bins of the high speed bin tray 12 are nearer to the travel path than the bins of the normal bin tray 14 since the bins of the high speed bin tray 12 are set at a higher position. A travel distance of the LEDs from the said travel path to the bins of the high speed bin tray 12 is therefore shorter than a travel distance to the bins of the normal bin tray 14. Each LED on a suction pad 24 is rotated to the locations of the high speed bin tray 12 and normal bin tray 14 by the turntable 30 which is driven by a turret motor 44.

Both the high speed bin tray 12 and the normal bin tray 14 receive LEDs through tubing structures. A first tubing structure leads to the bins of the high speed bin tray 12 and a second tubing structure leads to the bins of the normal bin tray 14. The first tubing structure preferably comprises a movable output tubing 46 and relatively stationary secondary tubings 33 whereas the second tubing comprises a movable output tubing 38 and relatively stationary secondary tubings 39.

When the LED has been assigned a high speed bin, the LED is dropped into the allocated bin in the high speed bin tray 12 when the movable output tubing 46 is positioned over a hole on a hole plate 36 by a high speed bin rotary mechanism 34. The hole is connected to a respective secondary tubing 33 leading to the assigned bin in the high speed bin tray 12. The holes on the hole plate 36 and the secondary tubings 33 are preferably arranged in a circular fashion. Additionally, the hole plate 36 is small because there are fewer bins in the high speed bin tray 12. Thus, the high speed bin rotary mechanism 34 operates and positions the output tubing 46 relatively faster than a conventional XY table 42 used for the normal bin tray 14.

When the LED has not been assigned a high speed bin, it would be further rotated to the location of the normal bin tray 14 where it is dropped into an allocated bin in the normal bin tray 14 when the movable output tubing 38 is positioned over a hole on a hole plate 37 by the XY table 42. The hole is connected to a respective secondary tubing 39 leading to the assigned bin in the normal bin tray 14. The normal hole plate 37 is bigger than the high speed hole plate 36 because of more bins in the normal bin tray 14. Accordingly, the XY table 42 operates relatively slower than the rotary mechanism 34 used for the high speed bin tray 12.

It would also be noted from this illustration that the movable output tubing 46 channeling LEDs with more common characteristics to the hole plate 36 is substantially shorter than the movable output tubing 38 channeling LEDs with less common characteristics to the hole plate 37. The shorter movable output tubing 46 and the smaller hole plate 36 allow faster entry of LEDs into the bins of the high speed bin tray 12. Comparatively, the longer movable output tubing 38 and the bigger hole plate 37 slow down the process of sorting LEDs into the normal bin tray 14.

Furthermore, as the LEDs are channeled to the high speed bin tray 12 and the normal bin tray 14 at two separate locations by two separate sets of tubing structures, the LEDs are loadable into the bins in the high speed bin tray 12 and the normal bin tray 14 substantially simultaneously. Hence, the normal bin tray 14 may be configured to receive all the LEDs that are receivable by the high speed bin tray 12 when the high speed bin tray 12 is not in operation. When the operator needs to collect a high speed bin which has received a preset number of LEDs indicating that it is full, LEDs originally intended for unloading into the high speed bins can continue to be sorted into corresponding normal bins that are still available in the normal bin tray 14 for LEDs having the same characteristics. It is thus not necessary to halt the machine when removing a high speed bin and increased machine availability time is thereby achieved.

Another feature in the preferred embodiment of this invention is the presence of counter sensors 32, 40 which are located at the exits of the movable output tubings 46, 40, such as at the high speed bin rotary mechanism 34 and the XY table 42 respectively. The counter sensors 32, 40 are operative to determine when an LED has entered the hole plates 36, 37, as well as to count the number of LEDs that have passed through. They provide a fast and reliable method for consecutive binning into the same bin.

In a conventional sorting system, the sorter has to wait for an LED to pass through an output confirmation sensor at the end of the movable output tubing 38 just above the hole plate 37 even when the next LED is to be unloaded into the same bin. The next LED will only be unloaded into an allocated bin after the output confirmation sensor has registered the unloading of the preceding LED and confirms that the LED has entered the hole plate 37. This delays the unloading of LEDs and constitutes unnecessary waiting time when the same bin is assigned to the next LED being sorted.

In the preferred embodiment of the invention, a counter board is operatively connected to the counter sensors 32, 40 to count the number of LEDs that pass through the hole plates 36, 37. Thus, it is no longer necessary to wait for the output confirmation sensor to register the unloading of a preceding LED into a bin before the next LED is introduced into the movable output tubings 46, 38. If the same bin is assigned, the next LED can be unloaded almost immediately as the bin counter sensors 32, 40 monitor the number of LEDs that have been unloaded. This speeds up consecutive binning of LEDs into the same bin.

Figure 5:
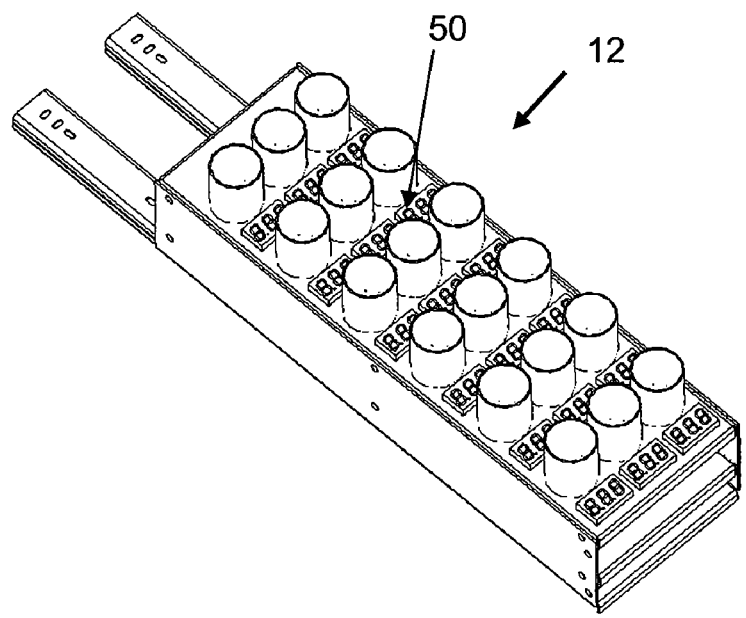
FIG. 5 is an isometric view of the high speed bin tray including LCD display panels adjacent to the bins.

FIG. 5 is an isometric view of the high speed bin tray 12 including LCD display panels 50 adjacent to the bins. Each LCD display panel 50 is associated with each bin in the high speed bin tray 12 and displays an assigned bin number of the bin. The LCD display panel 50 next to a bin is immediately updated with an assigned bin number by the processor 31 once that bin has been earmarked as a frequently used bin. This allows an operator to identify and collect a specific assigned bin quickly when the time comes for unloading the bins. The LCD display panel 50 allows the bin number to be easily and automatically changed by the test handler 10 for different batches of LED devices.

Figure 6:
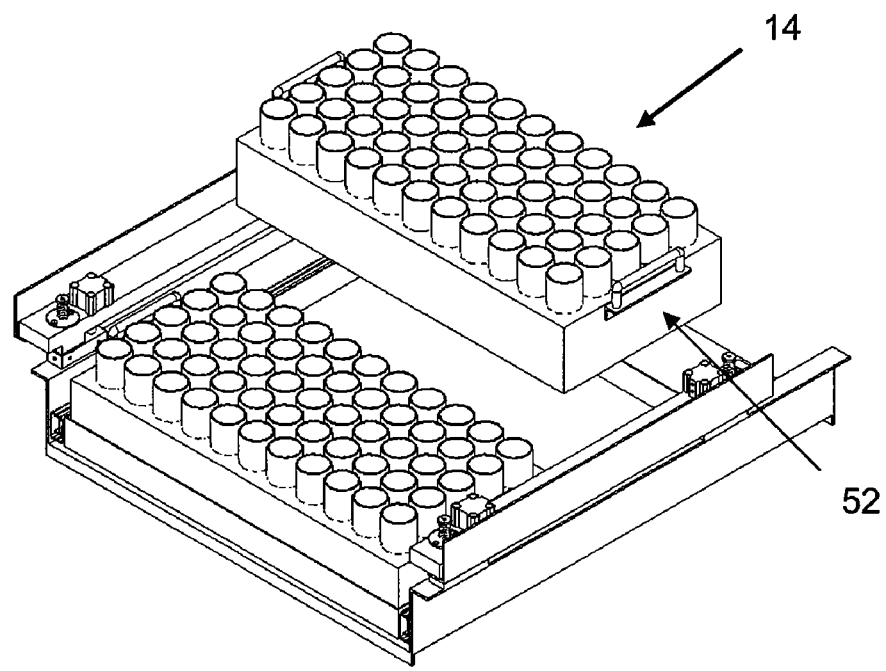
FIG. 6 is an isometric view of the normal bin tray with a portion of the tray removed.

FIG. 6 is an isometric view of the normal bin tray 14 with a portion 52 of the tray removed. Portions 52 of the tray 14 may be removed for emptying the contents of the bins and these may be replaced with empty trays to continue the sorting operation while the contents of the bins are removed.

The invention described herein is susceptible to variations, modifications and/or additions other than those specifically described and it is to be understood that the invention includes all such variations, modifications and/or additions which fall within the spirit and scope of the above description.

The invention claimed is:

1. A sorting apparatus configured to sort electronic components, the sorting apparatus comprising:
    a testing station configured for testing and determining a characteristic of each electronic component;
    a first tray comprising a first plurality of receptacles for receiving tested electronic components;
    a second tray comprising a second plurality of receptacles for receiving tested electronic components, the second plurality having a number of receptacles greater than the number of receptacles of the first plurality of receptacles of the first tray; and
    a processor configured and operative to determine a frequency of tested characteristics occurring in the electronic components, and to assign a receptacle to each selected tested characteristic such that electronic components having a first characteristic of the tested characteristics, the first characteristic occurring with greater frequency than remaining characteristics of the tested characteristics, are assigned receptacles comprised in the first tray and electronic components having a tested characteristic occurring with lower frequency are assigned receptacles comprised in the second tray; and
    a tray loading apparatus configured and operative for loading the electronic components into the respective receptacles assigned by the processor.

2. The sorting apparatus as claimed in claim 1, wherein the first tray comprises a number of receptacles sufficient only to receive electronic components that have characteristics which occur with greater frequency whereas the second tray comprises a number of receptacles sufficient to receive all the electronic components tested.

3. The sorting apparatus as claimed in claim 2, wherein the second tray is configured to receive, when the first tray is inoperative to receive electronic components, all the electronic components assigned to the first tray.

4. The sorting apparatus as claimed in claim 1, wherein the trays and the tray loading apparatus are positioned and configured such that each electronic component is caused to pass through a location of the first tray prior to arriving at a location of the second tray.

5. The sorting apparatus as claimed in claim 1, wherein the tray loading apparatus and the trays are positioned and configured such that the electronic components are transferred along a travel path above a location of the first tray and the second tray, and the receptacles of the first tray are nearer to the travel path than the receptacles of the second tray.

6. The sorting apparatus as claimed in claim 1, wherein the receptacles of the trays are positioned such that a travel distance of the electronic components from a travel path to the receptacles of the first tray is shorter than a travel distance from the travel path to the receptacles of the second tray.

7. The sorting apparatus as claimed in claim 1, wherein the tray loading apparatus comprises a first tubing structure configured to lead electronic components from the testing station to the receptacles of the first tray and a second tubing structure separate from the first tubing structure, the second tubing structure configured to lead electronic components from the testing station to the receptacles of the second tray.

8. The sorting apparatus as claimed in claim 7, wherein each of the first and second tubing structures comprises a movable output tubing configured to lead electronic components from the testing station and secondary tubing, the stationary tubing being stationary relative to the trays and positioned and configured for receiving electronic components from the movable output tubing.

9. The sorting apparatus as claimed in claim 8, further comprising a rotary mechanism configured to position the movable output tubing of the first tubing structures.

10. The sorting apparatus as claimed in claim 8, further comprising a counter sensor associated with the movable output tubing and configured and operative to determine when an electronic component has passed through the movable output tubing.

11. The sorting apparatus as claimed in claim 10, wherein the counter sensor is positioned at an exit of the movable output tubing.

12. The sorting apparatus as claimed in claim 10, further comprising a counter board operatively connected to the counter sensor and configured and operative to count a number of electronic components that pass through the movable output tubing.

13. The sorting apparatus as claimed in claim 1, wherein the first and second trays are positioned and configured so as to receive simultaneously the electronic components.

14. The sorting apparatus as claimed in claim 1, further comprising an LCD display associated with each receptacle in the first tray and configured to display an assigned receptacle number of the receptacle.

15. The sorting apparatus as claimed in claim 1, further comprising a turntable which is configured and operative to move the electronic components sequentially from the test station to the first and second trays.

16. The sorting apparatus as claimed in claim 1, wherein the processor is further operative to assign receptacle numbers to the receptacles in the first tray.

17. A method of sorting electronic components using a sorting apparatus to sort the electronic components, the sorting apparatus comprising:
- a testing station configured for testing and determining a characteristic of each electronic component;
- a first tray comprising a first plurality of receptacles for receiving tested electronic components;
- a second tray comprising a second plurality of receptacles for receiving tested electronic components, the number of receptacles of the second plurality of receptacles being greater than the number of receptacles of the first plurality of receptacles;
- a processor configured and operative to determine a frequency of tested characteristics occurring in the electronic components, and to assign a receptacle to each selected tested characteristic such that electronic components having a first characteristic of the tested characteristics, the first characteristic occurring with greater frequency than remaining characteristics of the tested characteristics, are assigned receptacles comprised in the first tray and electronic components having a tested characteristic occurring with lower frequency are assigned receptacles comprised in the second tray; and
- a tray loading apparatus configured and operative for loading the electronic components into the respective receptacles assigned by the processor, the method comprising the steps of:
- testing and determining the characteristic of each electronic component using the testing station;
- determining, using the processor, which tested characteristics of the electronic components occur most frequently;
- assigning, by using the processor, a receptacle to each selected tested characteristic such that electronic components having a first characteristic of the tested characteristics, the first characteristic occurring with greater frequency than remaining characteristics of the tested characteristics, are assigned the receptacles comprised in the first tray and electronic components having a tested characteristic occurring with lower frequency are assigned the receptacles comprised in the second tray;
- loading, using the tray loading apparatus, electronic components having tested characteristics that occur with greater frequency into receptacles of the first tray; and
- loading, using the tray loading apparatus, electronic components having tested characteristics that occur with lower frequency into receptacles of the second tray.

18. The method as claimed in claim 17, wherein the second tray is configured to receive, when the first tray is inoperative to receive electronic components, all the components assigned to the first tray, the method further comprising the step of loading all the electronic components having different characteristics into the receptacles of the second tray when of the first tray is inoperative.

19. The method as claimed in claim 17, wherein the processor is further operative to assign receptacle numbers to the receptacles in the first tray, the method further comprising the step of the processor assigning receptacle numbers to the receptacles in the first tray once the tested characteristics that occur with greater frequency have been determined.

20. A sorting apparatus configured to sort electronic components, the sorting apparatus comprising:
- a testing station for testing and determining a characteristic of each electronic component;
- a first tray having a plurality of receptacles configured to receive tested electronic components;
- a second tray comprising a second plurality of receptacles configured to receive electronic components, the second plurality having a number of receptacles greater than the number of receptacles of the first plurality of receptacles of the first tray;
- a processor configured and operative to determine a frequency of tested characteristics occurring in the electronic components, and to assign a receptacle to each selected tested characteristic such that electronic components having a first characteristic of the tested characteristics, the first characteristic occurring with greater frequency than remaining characteristics of the tested characteristics, are assigned receptacles comprised in the first tray and electronic components having a tested characteristic occurring with lower frequency are assigned to receptacles comprised in a second tray;
- a first movable tubing positioned, configured and operative to receive from the testing station tested electronic components that have the first characteristic, the first movable tubing being operatively connected and configured to load such electronic components into the first tray having a plurality of receptacles for the electronic components; and a second movable tubing positioned, configured and operative to receive from the testing station tested electronic components that have the tested characteristic with the lower frequency, the second movable tubing being operatively connected and configured to load such electronic components into the second tray having more receptacles for the electronic components than the first tray.

21. The sorting apparatus as claimed in claim 20, wherein the first movable tubing comprises a first tubing structure configured to lead the electronic components to the receptacles of the first tray and the second movable tubing comprises a second tubing structure configured to lead the electronic components to the receptacles of the second tray.

22. The sorting apparatus as claimed in claim 21, wherein the first movable tubing is further connected to a first set of relatively stationary secondary tubings connected to the receptacles of the first tray and the second movable tubing is further connected to a second set of relatively stationary secondary tubings connected to the receptacles of the second tray.

23. A sorting apparatus configured to sort electronic components, the sorting apparatus comprising:
   a testing station for testing and determining a characteristic of each electronic component;
   a first tray having a plurality of receptacles configured to receive tested electronic components;
   a second tray comprising a second plurality of receptacles configured to receive electronic components, the second plurality having a number of receptacles greater than the number of receptacles of the first plurality of receptacles of the first tray;
   a processor configured and operative to determine a frequency of tested characteristics occurring in the electronic components, and to assign a receptacle to each selected tested characteristic such that electronic components having a first characteristic of the tested characteristics, the first characteristic occurring with greater frequency than remaining characteristics of the tested characteristics, are assigned receptacles comprised in the first tray and electronic components having a tested characteristic occurring with lower frequency are assigned to receptacles comprised in a second tray;
   a first component transmission device positioned, configured and operative to receive from the testing station tested electronic components that have the first characteristic, the first component transmission device being operatively connected and configured to load such electronic components into the first tray having a plurality of receptacles for the electronic components; and
   a second component transmission device also located, configured and operative to receive from the testing station tested electronic components that have the tested characteristic which occurs with relatively lower frequency, the second component transmission device being operatively connected and configured to load such electronic components into a second tray having more receptacles for the electronic components than the first tray.

24. A sorting apparatus as claimed in claim 1, wherein the electronic components are light emitting diodes.

* * * * *